(12) United States Patent (10) Patent No.: US 7,649,257 B2
Gordon et al. (45) Date of Patent: Jan. 19, 2010

(54) DISCRETE PLACEMENT OF RADIATION SOURCES ON INTEGRATED CIRCUIT DEVICES

(75) Inventors: Michael S. Gordon, Yorktown Heights, NY (US); Nancy C. LaBianca, Yalesville, CT (US); Kenneth P. Rodbell, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/051,881

(22) Filed: Mar. 20, 2008

(65) Prior Publication Data

US 2009/0236699 A1 Sep. 24, 2009

(51) Int. Cl.
*H01L 23/48* (2006.01)

(52) U.S. Cl. .............................. 257/737; 257/E21.508; 438/15; 438/613

(58) Field of Classification Search ................... 438/15, 438/613; 257/737, E21.508
See application file for complete search history.

(56) References Cited

U.S. PATENT DOCUMENTS

2006/0220654 A1* 10/2006 Zabel et al. .................. 324/501
2007/0220366 A1* 9/2007 Bose et al. ..................... 714/47

* cited by examiner

*Primary Examiner*—Trung Dang
(74) *Attorney, Agent, or Firm*—Schmeiser, Olsen & Watts; Louis J. Percello

(57) ABSTRACT

An integrated circuit and methods of forming and using the integrated circuit. The circuit includes: a radiation-emitting layer over a selected region of a top surface of an integrated circuit chip, the radiation emitting layer comprising a first polymer or resin and a first radioactive material, the region smaller than a whole of the top surface of the integrated circuit chip, the region including a circuit that is liable to temporary failure when struck by radiation generated by the first radioactive material.

21 Claims, 10 Drawing Sheets

DISCRETE PLACEMENT OF RADIATION SOURCES ON INTEGRATED CIRCUIT DEVICES

FIELD OF THE INVENTION

The present invention relates to the field of integrated circuit devices; more specifically, it relates to accelerated testing of the soft error sensitivity of integrated circuit devices to ionizing radiation.

BACKGROUND OF THE INVENTION

Conventional testing of integrated circuit chips for soft-error rates includes placing an alpha particle source between an integrated circuit chip and a supporting module. This exposes all circuits on the integrated circuit chip to radiation, which can make it difficult to determine the susceptibility of individual circuits to radiation. Accordingly, there exists a need in the art to overcome the deficiencies and limitations described hereinabove.

SUMMARY OF THE INVENTION

A first aspect of the present invention is a method of forming an integrated circuit chip, comprising: forming a radiation-emitting layer over a selected region of a top surface of the integrated circuit chip by dispensing a liquid mixture comprising a polymer or resin and a radioactive material over the selected region, the region smaller than the whole of the top surface of the integrated circuit chip, the region including a circuit liable to temporary failure when struck by radiation generated by the radioactive material.

A second aspect of the present invention is a method of forming an integrated circuit chip, comprising: forming a first radiation-emitting layer over an entire top surface of the integrated circuit chip by dispensing a liquid mixture comprising a first polymer or resin and a first radioactive material over the entire top surface of the integrated circuit chip; and photolithographically removing portions of the first radiation-emitting layer to form a first radiation-emitting island over a region of the integrated circuit chip, the region including a circuit liable to temporary failure when struck by radiation generated by the first radioactive material.

A third aspect of the present invention is an integrated circuit, comprising: a radiation-emitting layer over a selected region of a top surface of an integrated circuit chip, the radiation emitting layer comprising a first polymer or resin and a first radioactive material, the region smaller than a whole of the top surface of the integrated circuit chip, the region including a circuit that is liable to temporary failure when struck by radiation generated by the first radioactive material.

A fourth aspect of the present invention is a method, comprising: providing an integrated circuit chip having a functional circuit and a radiation-emitting layer containing a radioactive material formed over the function circuit, the radiation-emitting layer containing a radioactive material, the radiation emitting-layer smaller than a whole of the top surface of the integrated circuit chip, the functional circuit liable to temporary failure when struck by radiation generated by the radioactive material; measuring a soft-error rate of the functional circuit; and adjusting operation of the functional circuit based on the measured soft-error rate of the functional circuit.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Soft-errors in integrated circuits are caused by ionizing radiation, such as alpha particles passing through the semiconductor materials (e.g., silicon) of the integrated circuit. Both logic and memory circuits may be effected. The errors are called "soft" because they generally only persist until the next cycle of the integrated circuit function. As an alpha particle passes through semiconductor material (e.g., silicon) a "cloud" of electron-hole pairs is generated in the vicinity of its path. Electric fields present in the integrated circuit can cause the holes and electrons to migrate in opposite directions thus causing extra charge to reach particular circuit nodes and change the charge on those nodes.

In one example, the embodiments of the present invention are practiced on substantially complete integrated circuit chips that are fully functional.

Figure 1:
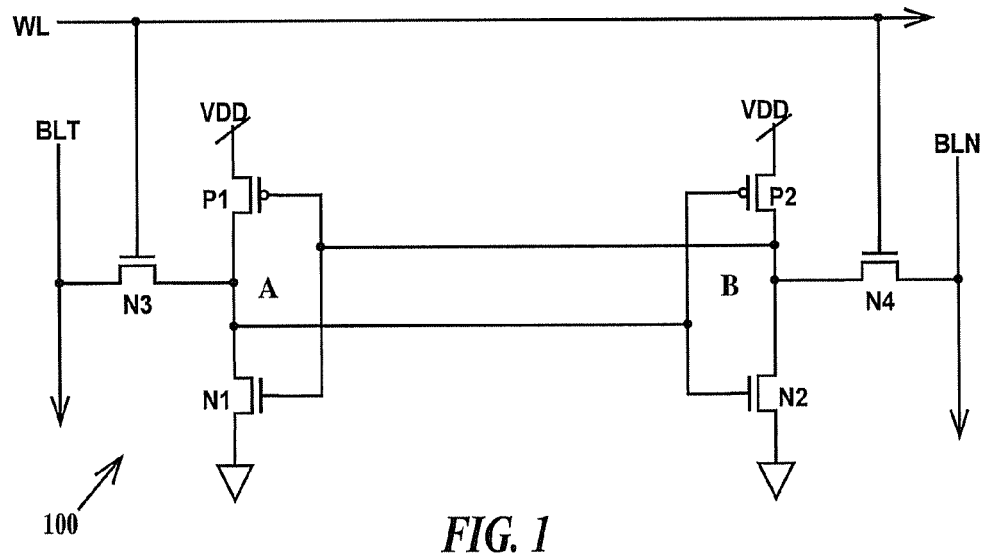
FIG. 1 is a circuit diagram of an exemplary static random access memory (SRAM) cell.

FIG. 1 is a circuit diagram of an exemplary static random access memory (SRAM) cell. In FIG. 1, SRAM cell 100 includes PFETs P1 and P2 and NFETs N1, N2, N3 and N4. PFET P1 and NFET N1 form a first inverter and PFET P2 and NFET N2 form a second inverter. The first and second inverters are cross-coupled. NFETs N3 and N4 are pass gate devices. The sources of PFETs P1 and P2 are connected to VDD. The sources of NFETs N1 and N2 are connected to ground. The source of NFET N3 is connected to a bitline true line BLT and source of NFET N4 is connected to a bitline not line BLN. The drains of PFET P1 and NFETs N1 and N3 are connected at a node A. The drains of PFET P2 and NFETs N2 and N4 are connected at a node B. The connections of the source/drains of NFETs N3 and N4 may be reversed. The gates of NFETs N3 and N4 are connected to a wordline WL. The gates of PFET P1 and NFET N1 are connected to node B and the gates of PFET P2 and NFET N2 are connected to node A.

Figure 2:
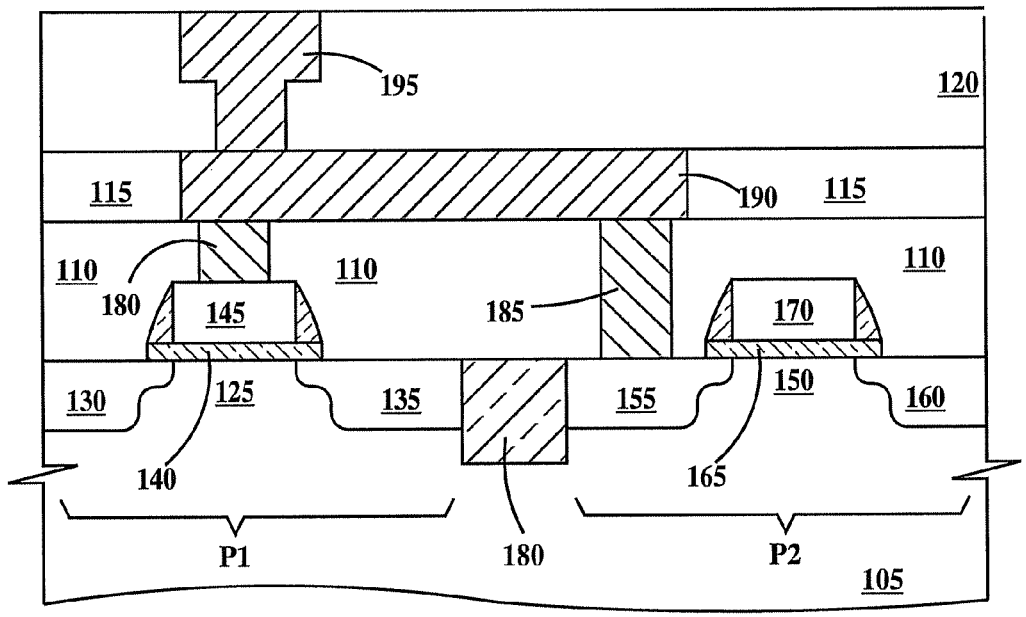
FIG. 2 is cross-section view illustrating an exemplary physical structure of a portion of the SRAM cell of FIG. 1.

FIG. 2 is cross-section view illustrating an exemplary physical structure of a portion of the SRAM cell of FIG. 1. It should be understood that the physical wiring illustrated in FIG. 2 is only one of very many different physical wiring schemes that are possible and any particular wiring scheme is dependent on the layout of the SRAM cell and the technology used to fabricate the SRAM. In FIG. 2, formed on a top surface of silicon substrate 105 is a dielectric passivation layer 110. Formed on a top surface of passivation layer 110 is an interlevel dielectric layer (ILD) 115. Formed on a top surface of ILD layer 115 is an ILD layer 120.

PFET P1 includes a channel region 125 between a source 130 and a drain 135 formed in substrate 105, a gate dielectric layer 140 formed over channel region 125 and a gate 145 formed over gate dielectric layer 125. PFET P2 includes a channel region 150 between a drain 155 and a source 160 formed in substrate 105, a gate dielectric layer 165 formed over channel region 150 and a gate 170 formed over gate dielectric layer 165. Formed in passivation layer 110 is an electrically conductive contact 180 to gate 145 and an electrically conductive contact 185 to drain 155. An electrically conductive wire 190 is formed in ILD layer 115. Wire 190 physically and electrically connects contact 180 and contact 185. Relative to FIG. 1, drain 155 is electrically part of node B of FIG. 1. It should be understood that ILD layer 120 represents an uppermost ILD layer and that there can be many additional ILD layers, each containing wires, between ILD layer 120 and ILD layer 115.

By way of example, ionizing radiation striking drain 155 can cause charge to build up on node B. If there had been a zero stored on node B this charge could be read as a one if the cell is read out before a refresh.

Figure 3:
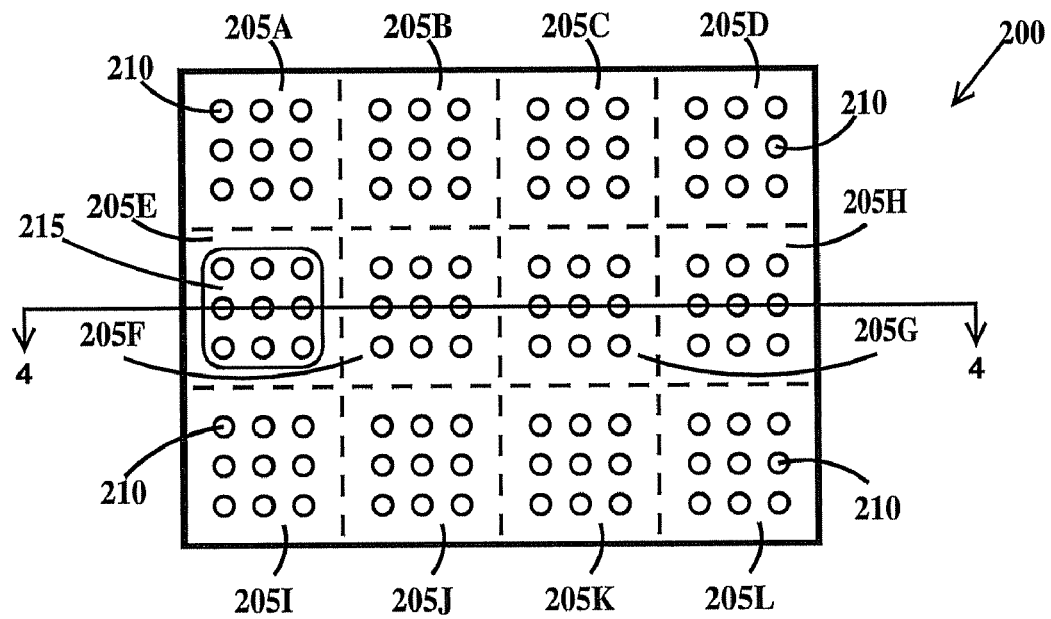
FIG. 3 is a top view of an exemplary integrated circuit according to a first embodiment of the present invention.

FIG. 3 is a top view of an exemplary integrated circuit according to a first embodiment of the present invention. In FIG. 3, an integrated circuit chip 200 includes integrated circuit regions 205A through 205L. Integrated circuit regions 205A through 205L may include active devices such as transistors (e.g., field effect transistor and bipolar transistors) and diodes and passive devices such as resistor, capacitors and inductors that are wired together by one or more electrically conductive wires formed in dielectric layers of the integrated circuit chip into, for example, logic circuits and memory circuits. These circuits may include, for example, SRAMs, dynamic random access memories (DRAMs), latches, flip-flops, registers and other circuits that are sensitive to radiation events which can trigger soft error fails in those circuits. Integrated circuit 200 is a completed integrated circuit, in that no further chip related processing is required to make the integrated circuit functional with the possible exception of certain testing and fuse blowing which may or may not be considered part of the chip fabrication process.

A plurality of solder bumps 210 have been formed on the top surface of integrated circuit chip 200. Another name for sold bumps are C4 connections (controlled collapse chip connection). Solder bumps 210 allow electrical connection between integrated circuits within integrated circuit chip 200 and electrical devices external to the integrated circuit chip for signal and power transmission. Solder bumps should be considered exemplary of many different types of interconnection technologies that may be used including, for example, solder columns, wire bonds, ball bonds and tape automated bonding (TAB).

A radiation-emitting layer 215 is formed on the top surface of integrated circuit region 205E. Integrated circuit region 205E includes a radiation sensitive circuit such as those described supra. Radiation-emitting layer 215 advantageously emits alpha particles. While radiation-emitting layer 215 is illustrated in FIG. 3 as being formed on region 205E, additional radiation-emitting layers may be formed on other circuit regions of integrated circuit chip 200. While solder bumps 210 are illustrated in region 205E, it is not required that there be any external connections in regions of integrated circuit chip 200 where radiation-emitting layer 215 is formed.

Figure 4A:
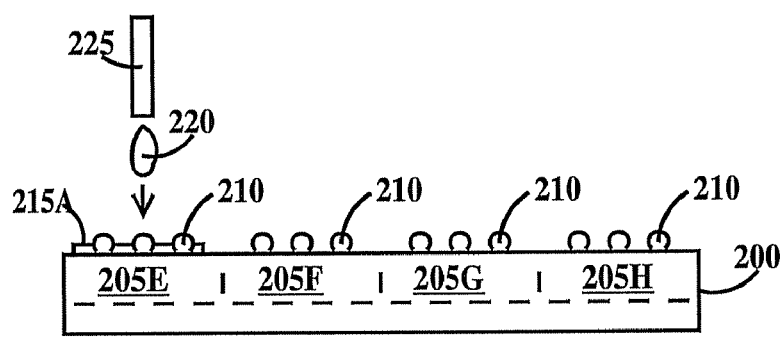
FIGS. 4A through 4C are cross-section views through line 4-4 of FIG. 3, illustrating fabrication of an integrated circuit device according to the first embodiment of the present invention.
Figure 4B:
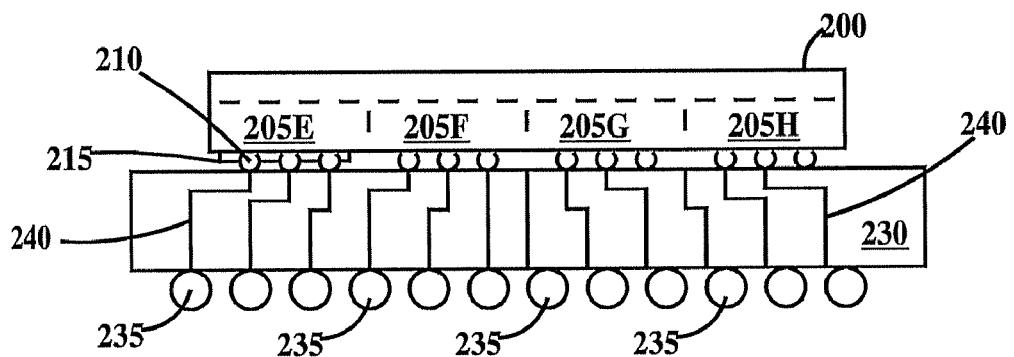
Figure 4C:
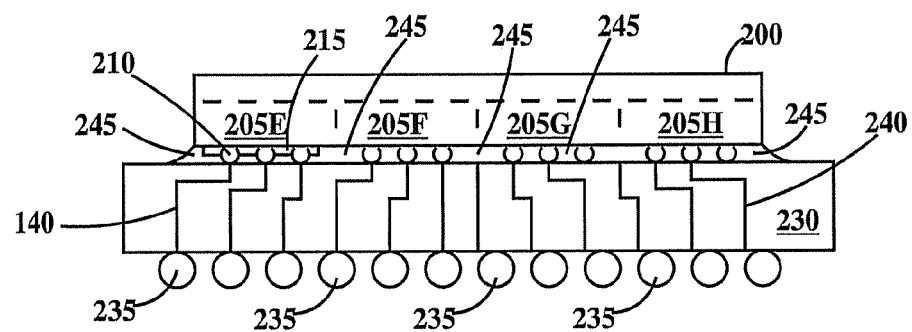

FIGS. 4A through 4C are cross-section views through line 4-4 of FIG. 3, illustrating fabrication of an integrated circuit device according the first embodiment of the present invention. FIGS. 4A through 4C continue the example of FIG. 3 and use solder bump technology. In FIG. 4A, after formation of solder bumps 210, a drop of uncured radiation-emitting material 220 is dispensed by a dispenser 225 on to the top surface of integrated circuit chip 200 in region 205E to form an uncured radiation-emitting layer 215A. Uncured radiation-emitting material includes one or more radioactive species. It should be understood that a single radioactive species may generate more than one type of radiation. In one example, uncured radiation-emitting material 220 includes an uncured polymer or resin and a radioactive species selected from the group $^{210}$Po, $^{210}$Pb, $^{241}$Am, $^{232}$Th, $^{NAT}$Sm, alpha-particle emitting isotopes of Th, U, Pu, Ra and Rn, or combinations thereof. (NAT indicates a naturally occurring element where one or more of it's isotopes is radioactive). In one example, uncured radiation-emitting material 220 is an epoxy resin. Uncured radiation-emitting material 220 may optionally include a filler. In one example the filler includes $SiO_2$. In one example, uncured radiation-emitting material 220 includes an uncured photoactive material (e.g., a photoresist) containing a radioactive species selected from the group $^{210}$Po, $^{210}$Pb, $^{241}$Am, $^{232}$Th, $^{NAT}$Sm, alpha-particle emitting isotopes of Th, U, Pu, Ra and Rn, or combinations thereof. In one example, the photoactive material is an epoxy based negative photoresist. Negative photoresists polymerize when exposed to actinic radiation as opposed to positive photoresists which de-polymerize when exposed to actinic radiation. A suitable photoresist for practicing the present invention is SU-8, a chemically amplified epoxy based negative photoresist manufactured by MicroChem of Newton, Mass.

In FIG. 4B, the uncured layer 215A (see FIG. 4A) has been thermally cured (i.e., heated to a temperature above room temperature) to polymerize and/or cross-link the resin or photoresist or ultra-violet (UV) cured by exposure to UV light to polymerize and/or cross-link the resin or photoresist to form radiation-emitting layer 215. The radiation-emitting layer does not completely cover solder bumps 210 (if present) so as not to interfere with the solder bonding process of flip chip mounting integrated circuit chip 200 to a module 230. Substrate 230 includes wires 240 connecting substrate pads (not shown) on a top surface of module 230 to solder balls (or alternatively, metal pins) extending from a bottom surface of module 230. The solder bonding process, also called reflowing, heats solder bumps 210 above room temperature (with or without a flux, in an inert and/or reducing atmosphere) to form solder joints with the substrate pads (not shown) on the top surface of module 230.

In FIG. 4C, an optional under-fill layer 245 is applied and thermally cured to fill the spaces between integrated circuit chip 200 and module 230. Examples of materials for under-fill layer include all the materials listed supra for uncured radiation-emitting material 220 without the radioactive species.

In the case of wire bonding or TAB packaging, radiation-emitting material 220 (see FIG. 4A) is dispensed after wire/tape bonding the integrated circuit chip (top surface up) to the supporting module and then the radiation-emitting material is cured.

The first embodiment of the present invention provides precise methods of placing precisely tuned radiation emitting (as energy distribution of radiation and flux) layers over selected regions of integrated circuit chips, limited only by minimum drop size that can be dispensed and the viscosity of the dispensed fluid.

Figure 5A:
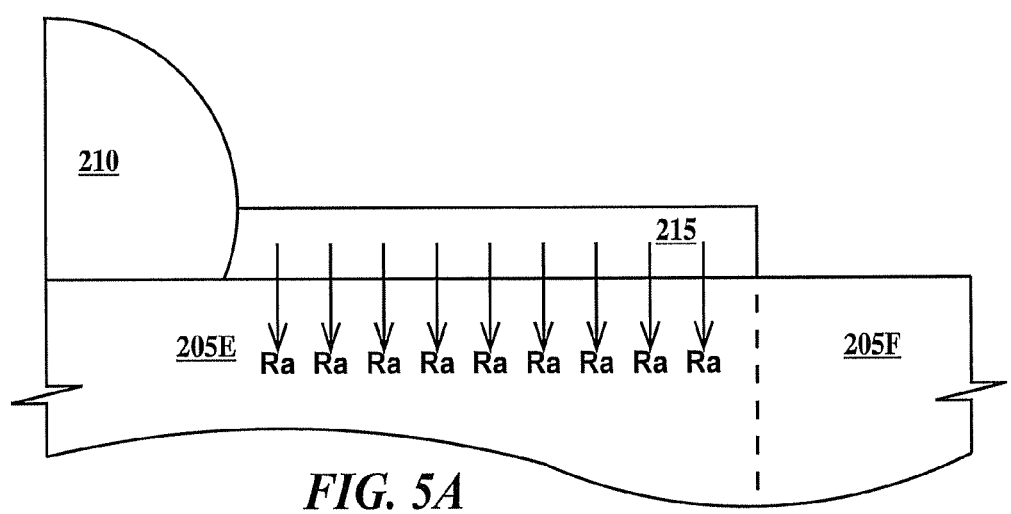
FIGS. 5A through 5E are cross-sectional views illustrating various embodiments of the radiation-emitting layer of FIGS. 3, 4B, 4C, 6A, 6B, 7A and 7B.

FIGS. 5A through 5E are cross-sectional views illustrating various embodiments of the radiation-emitting layer of FIGS. 3, 4B, 4C, 6A, 6B, 7A and 7B. In FIG. 5A, radiation-emitting layer 215 includes a single radioactive species generating radiation Ra that penetrates into integrated circuit region 205E. The thickness of radiation-emitting layer 215 and/or concentration of alpha particle emitting species in radiation-emitting layer 215 may be selected to tune the flux of alpha particles to a desired value.

Figure 5B:
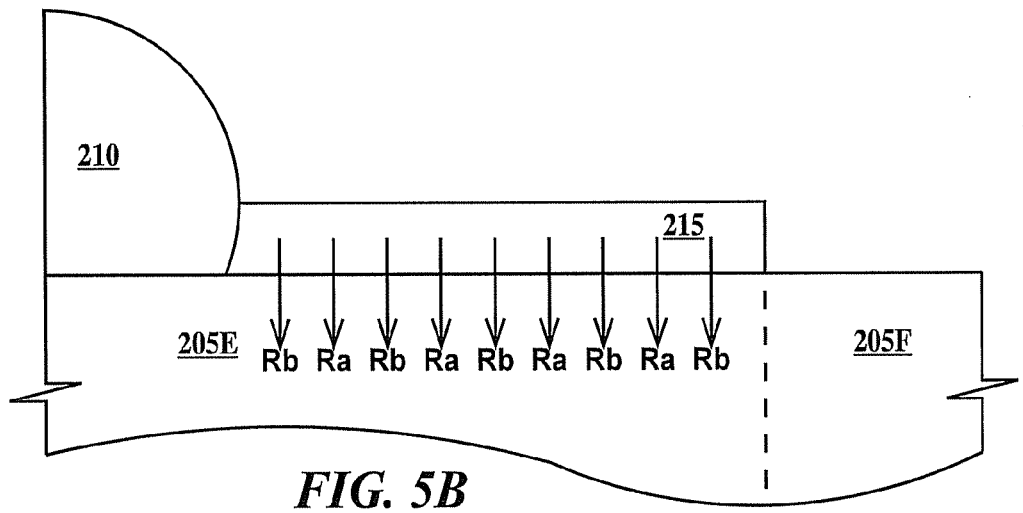

In FIG. 5B, radiation-emitting layer 215 includes a first and a second radioactive species generating radiation Ra and Rb respectively which penetrates into integrated circuit region 205E. Optionally, there may be more than two radioactive species in radiation-emitting layer 215. The use of two or more radioactive species is a first method of tailoring the energy distribution of the radiation penetrating into integrated circuit region 205E.

Figure 5C:
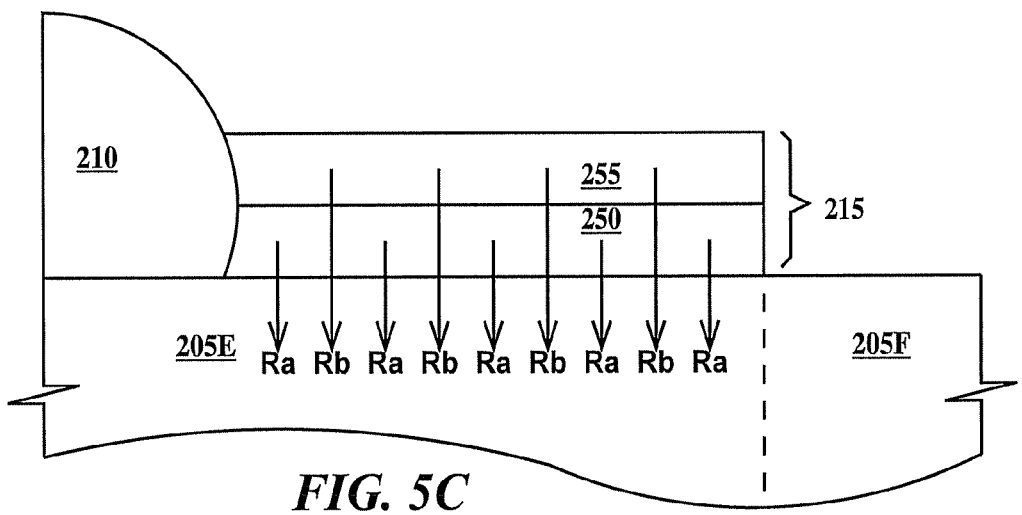

In FIG. 5C, radiation-emitting layer 215 includes a lower radiation-emitting layer 250 including a first radioactive species generating radiation Ra and an upper radiation-emitting layer 255 including a second radioactive species generating radiation Rb. Optionally, there may be more than one radioactive species in either or both of radiation-emitting layers 250 and 255. Optionally there may be more than two radiation-emitting layers in radiation-emitting layer 215. Since radiation Rb must pass through lower radiation-emitting layer 250, it becomes attenuated (both in flux and energy). The use of two or more radiation-emitting layers is a second method of tailoring the energy distribution of the radiation penetrating into integrated circuit region 205E. In one example, first radiation layer 250 is cured before applying second radiation-emitting layer 255.

Figure 5D:
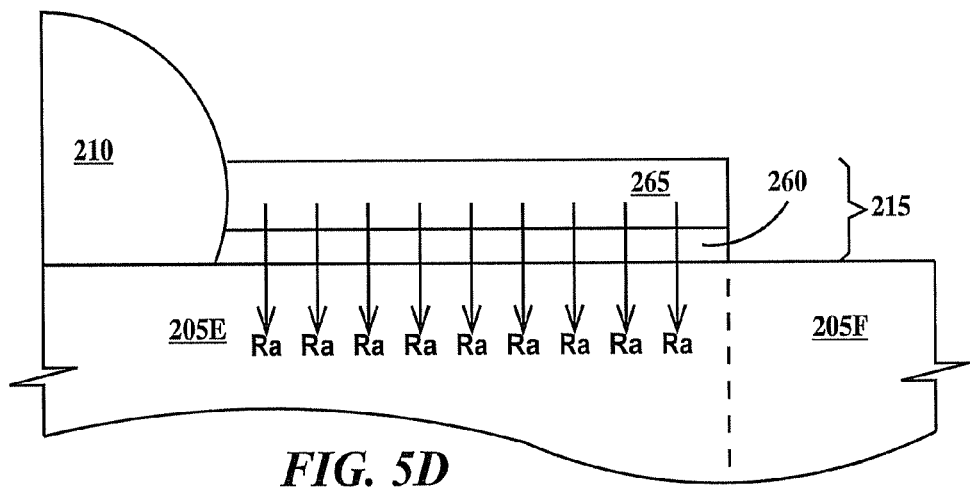

In FIG. 5D, radiation-emitting layer 215 includes a lower radiation-attenuating layer 260 and an upper radiation-emitting layer 265 including a radioactive species generating radiation Ra. Optionally, there may be more than one radioactive species in radiation-emitting layer 265. Optionally there may be more than two radiation-emitting layers in radiation-emitting layer 265. Since radiation Ra must pass through radiation-attenuating layer 260, it becomes attenuated (both in flux and energy). The use of a radiation-attenuating layer that itself does not generate radiation is a third method of tailoring the energy distribution of the radiation penetrating into integrated circuit region 205E. Radiation attenuating may be formed from a hard dielectric material, a metal, a polymer/resin, a metal particle filled dielectric or metal particle filled polymer/resin.

Figure 5E:
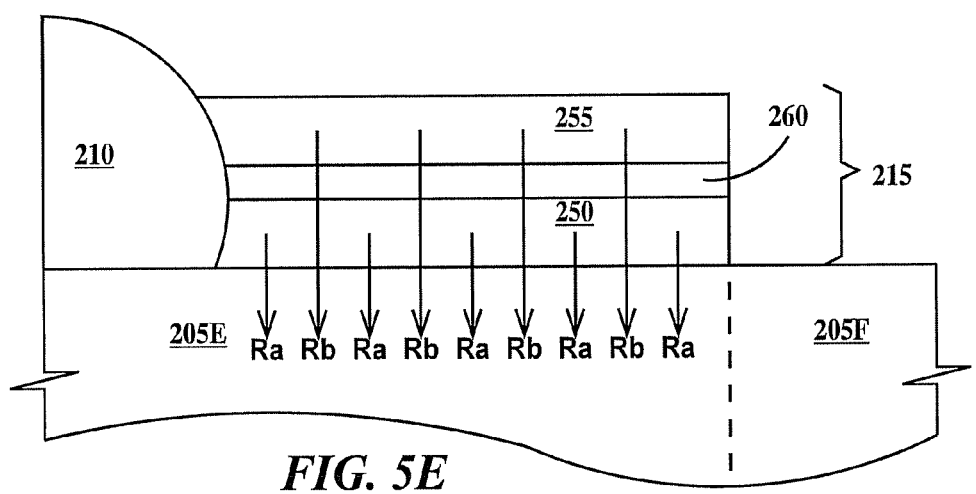

In FIG. 5E, radiation-emitting layer 215 includes a lower radiation-emitting layer 250 including first radioactive species generating radiation Ra, radiation attenuating layer 260, and upper radiation-emitting layer 250 including a second radioactive species generating radiation Rb. Optionally, there may be more than one radioactive species in either or both of radiation-emitting layers 250 and 255. Since radiation Rb must pass through radiation-attenuating layer 260 and radiation-emitting layer 250, it becomes attenuated (both in flux and energy). In one example, first radiation layer 250 is cured before forming radiation-attenuating layer 260. Optionally there may multiple radiation-attenuating layers interlaced between multiple radiation-emitting layers. The use of a radiation-attenuating layer that itself does not generate radiation between two or more radiation-emitting layers is a fourth method of tailoring the energy distribution of the radiation penetrating into integrated circuit region 205E.

Figure 6A:
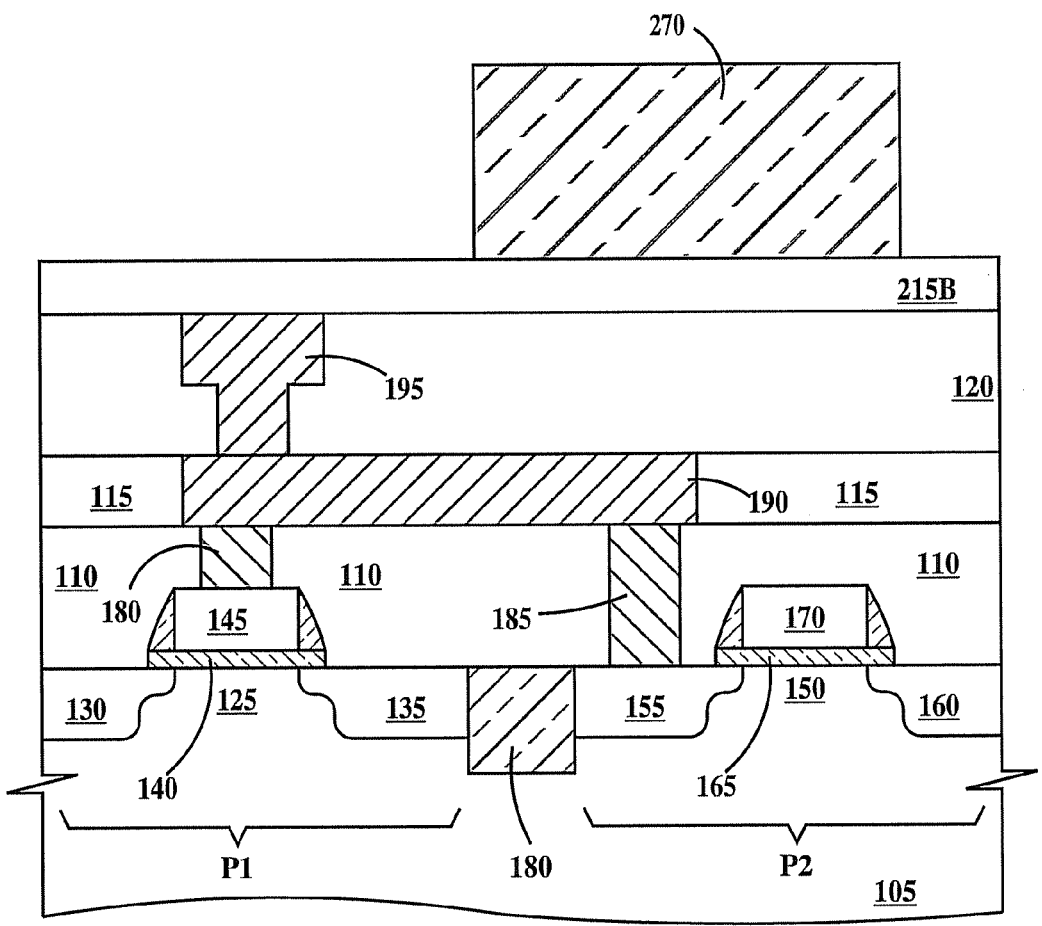
FIGS. 6A and 6B are cross-section views illustrating fabrication of an integrated circuit device according to a second embodiment of the present invention.
Figure 6B:
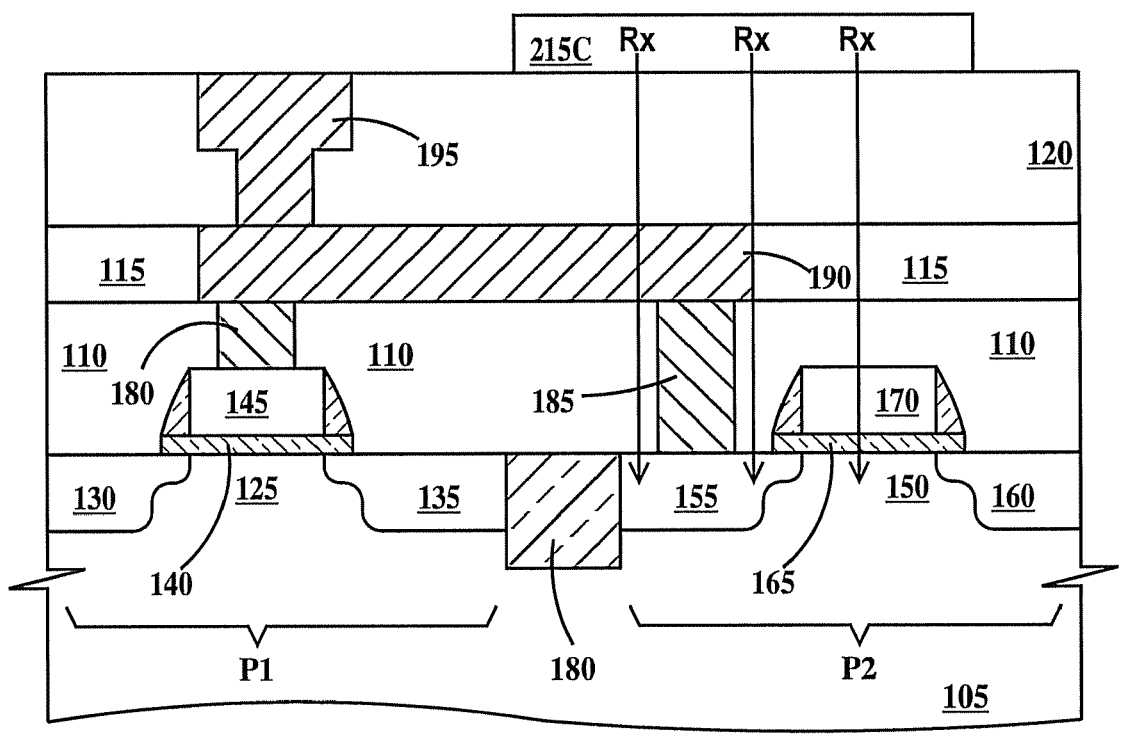

FIGS. 6A and 6B are cross-section views illustrating fabrication of an integrated circuit device according to a second embodiment of the present invention. The SRAM example of FIG. 2 will be used in describing the second embodiment, but it should be understood, the second embodiment of the present invention is not limited to SRAMs or the structures illustrated in FIGS. 6A and 6B.

FIG. 6A is similar to FIG. 2 except a radiation-emitting layer 215B has been deposited over the entire surface of the integrated circuit chip, a small portion of which is illustrated in FIG. 6A, a patterned layer of photoresist 270 formed over radiation emitting layer 215B using conventional photolithographic methods (e.g., exposure of a photoresist layer to actinic radiation through a patterned photomask followed by developing an image in the photoresist layer, exposure of photoresist to X-rays through a patterned photomask or exposure of a photoresist by a direct-write electron-beam system and subsequent development). In the second embodiment of the present invention, radiation-emitting layer is not photosensitive. Radiation-emitting layer 215B includes one or more radioactive species. It should be understood that a single radioactive species may generate more than one type of radiation. In one example, radiation-emitting layer 215B includes a polymer or resin and a radioactive species selected from the group $^{210}$Po, $^{210}$Pb, $^{241}$Am, $^{232}$Th, $^{NAT}$Sm, alpha-particle emitting isotopes of Th, U, Pu, Ra and Rn, or combinations thereof. In one example, radiation-emitting layer 215B includes an epoxy resin. Radiation-emitting layer 215 may optionally include a filler. In one example the filler includes $SiO_2$. Radiation-emitting layer 215B advantageously emits alpha particles.

In FIG. 6B, portions of radiation-emitting layer 215B not protected by photoresist layer 270 (See FIG. 6A) have been removed and afterwards the photoresist layer has been removed to leave a radiation-emitting island 215C directly over transistor P2. Radiation Rx from radiation-emitting island 215C penetrates to drain 155, causing charge to build up and potentially causing a soft-error fail in the SRAM cell. Radiation-emitting layer 215B (see FIG. 6A) may be cured before application of photoresist 270 in FIG. 6A or radiation-emitting island 215C may be cured if radiation-emitting layer 215B was not cured.

In an alternative method of the second embodiment of the present invention a radiation emitting layer (e.g., radiation emitting layer 215B of FIG. 6A) is photosensitive, so a photoresist layer (e.g., photoresist layer 270 of FIG. 6A) is not needed and radiation-emitting layer is patterned by exposing the photosensitive radiation emitting layer to actinic radiation and then developing the exposed photosensitive radiation emitting layer to form the radiation-emitting island. In one example of the third embodiment, the radiation-emitting layer includes an uncured photoactive material (e.g., a photoresist) containing a radioactive species selected from the group $^{210}$Po, $^{210}$Pb, $^{241}$Am, $^{232}$Th, $^{NAT}$Sm, alpha-particle emitting isotopes of Th, U, Pu, Ra and Rn, or combinations thereof. In one example, the photoactive material is an epoxy based negative photoresist. A suitable photoresist is again is SU-8 described supra. Curing would occur after the radiation-emitting island is formed.

Other variations of the second embodiment of the present invention include utilizing multiple radiation-emitting layers, radiation-attenuating layers and combinations of multiple radiation-emitting layers and radiation-attenuating layers as illustrated in FIGS. 5C, 5D and 5E and described supra. Further, in applying the teaching of FIGS. 5C and 5E to the third embodiment, radiation-emitting layer 255 may be photosensitive while radiation-emitting layer 250 is not photosensitive.

The second embodiment of the present invention, because it is subtractive process, can present material cost and disposal problems if the radioactive materials utilized are present in amounts that pose radiation hazards to living entities. The third embodiment of the present invention produces the same structure as the second embodiment, but does not utilize a subtractive process involving the radiation emitting layer.

Figure 7A:
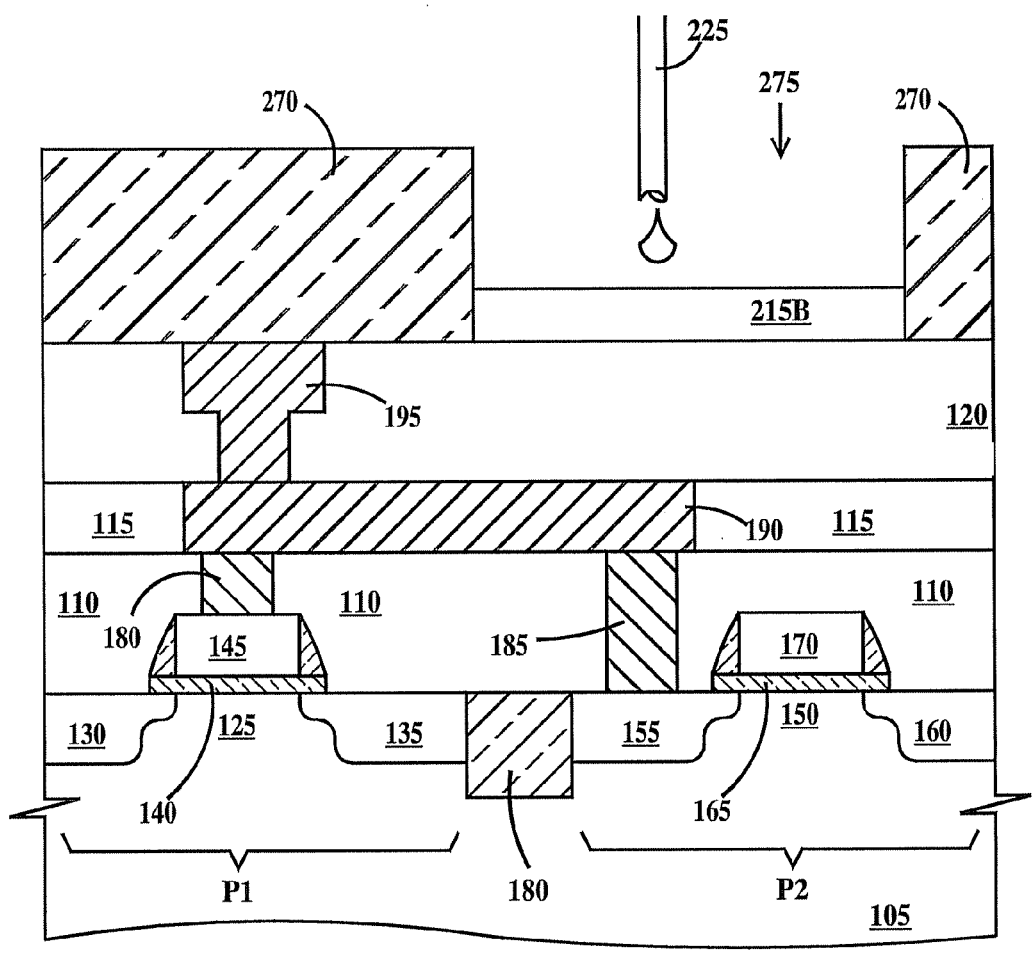
FIGS. 7A and 7B are cross-section views illustrating fabrication of an integrated circuit device according to a third embodiment of the present invention.
Figure 7B:
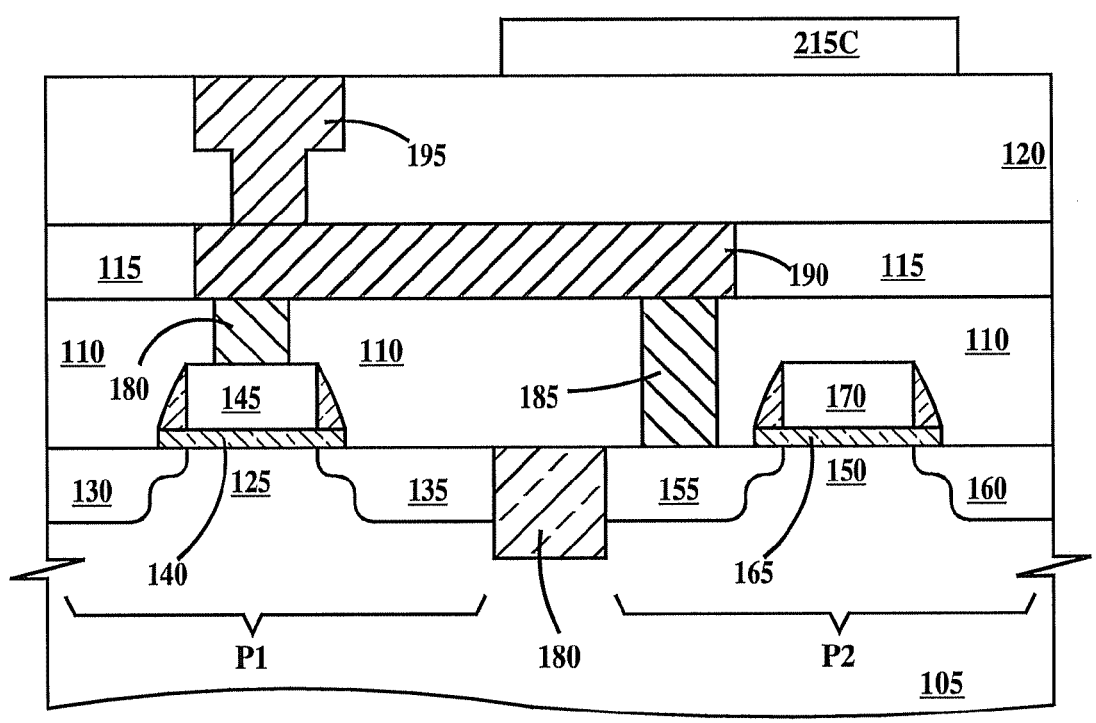

FIGS. 7A and 7B are cross-section views illustrating fabrication of an integrated circuit device according to a third embodiment of the present invention. In FIG. 7A an opening 275 is formed in photoresist layer 270 by conventional photolithographic methods and various radiation emitting materials are dispensed from dispenser 225 to form radiation emitting layer 215B. Several different materials may be dispensed in sequence, including materials that attenuate ionizing radiation to form the layers illustrated in FIGS. 5A through 5E and described supra.

In FIG. 7B, after curing (e.g., by heat or exposure to UV radiation) radiation emitting layer 215B and removing photoresist layer 270 (see FIG. 7A), radiation emitting island 215C is formed.

The second and third embodiments of the present invention provides ultra-precise methods of placing precisely tuned radiation emitting (as to type of radiation, flux and energy distribution) layers over very small regions (e.g., single FETs) to larger regions (e.g., a array of memory cells) of integrated circuit chips.

Figure 8:
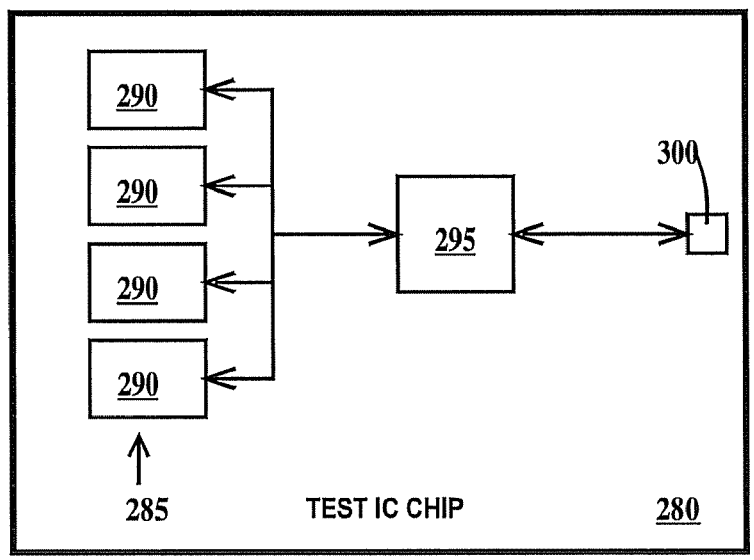
FIG. 8 is schematic representation of an exemplary integrated circuit device configured to utilize the embodiments of the present invention.
Figure 9:
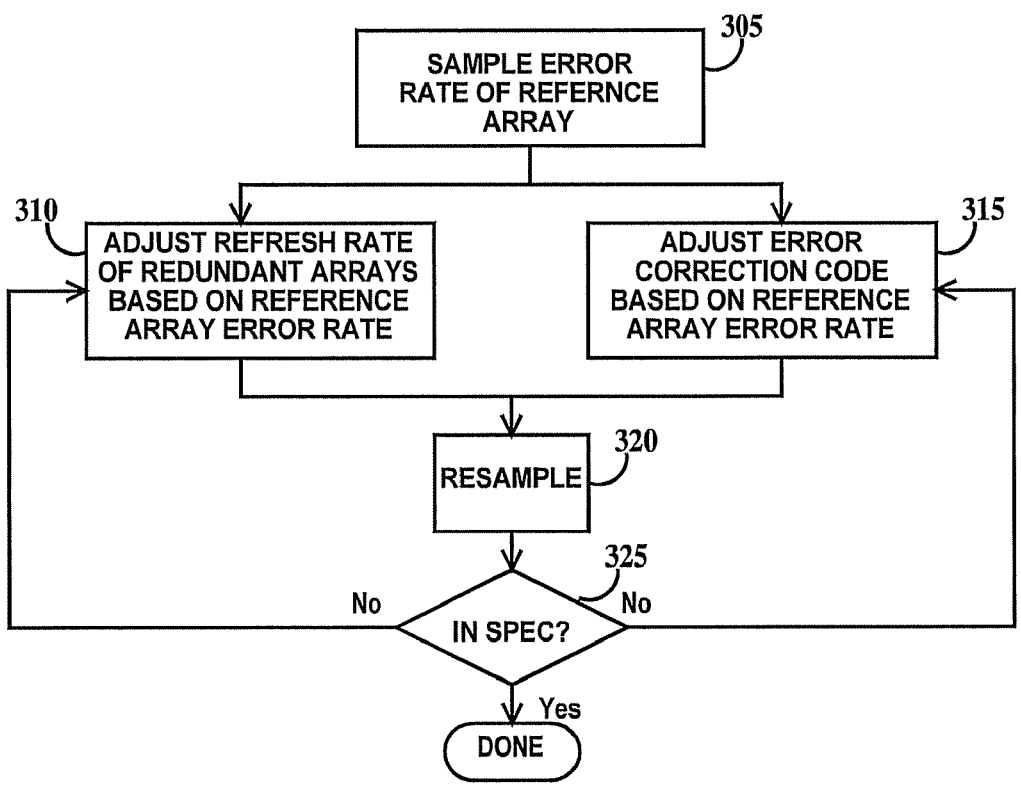
FIG. 9 is a flow diagram illustrating various methods of utilizing the embodiments of the present invention.

FIG. 8 is schematic representation of an exemplary integrated circuit device configured to utilize the embodiments of the present invention. In FIG. 8, a test integrated circuit chip 280 includes a set 285 of memory arrays 290, a control circuit 295 and a pad(s) 300 for communicating to devices off-chip. Each memory array 290 includes a different radiation-emitting layer (e.g., different radiation fluxes, different radiation types, different energy distributions or combinations of different radiation fluxes, types or energy distributions) formed by one of the embodiments described supra. Control circuit 295 detects the soft error rate of each memory array 290 and adjusts the operation of memory the memory array as illustrated in FIG. 9 and described infra. Test chip 280 may contain only a single memory array 285 or more than the four memory arrays illustrated in FIG. 8.

FIG. 9 is a flow diagram illustrating various methods of utilizing the embodiments of the present invention. In step 305, the soft-error rate of each memory array 290 of FIG. 8 is measured and one or more of the actions described in steps 310 and 315 taken. In step 310, the refresh rate of memory arrays 290 are adjusted based on the soft-error rate of the reference array. For example, if the soft-error rate is low, the refresh rate of the memory sub-arrays is corresponding low. If the soft error rate is higher, the refresh rate of the memory sub-arrays is corresponding increased. If the soft error rate is very low, the refresh rate of the memory sub-arrays is corresponding decreased.

In step 315, the error correction code algorithm is adjusted based on the soft-error rate of the reference array. For example, if the soft-error rate is low, the algorithm is adjusted to generate and/or examine fewer bits than a nominal number of correction bits. If the soft error rate is higher, the refresh rate the algorithm is adjusted to generate and/or examine more bits than the nominal number of correction bits. If the soft error rate is very low, the refresh rate the algorithm may be adjusted to generate and/or examine less bits than the nominal number of correction bits Then in step 320, the error rate is resampled (as described in reference to step 305). If in step 325, the soft-error rate meets or exceeds the specification, then the method is complete, otherwise the method proceeds back to step 310 or 315 where further adjustments are made.

In one example, only step(s) 310 are performed. In one example only steps (315) are performed. In one example, both step(s) 310 and 315 are performed. Step(s) 310 and step(s) 315 can be performed sequentially or in almost infinite combinations. When a adjustment results in a change that far out performs the specification, then adjustments can also be made to increase the soft-error rate in steps 310 and 315 as well.

While FIGS. 8 and 9 have been described using memory circuits, it should be understood that the structure and methods taught in FIGS. 8 and 9 and related text are not limited to memory circuits and can be applied to any functional circuit liable to temporary failure due to a radiation striking the function circuit.

Thus, the embodiments of the present invention overcome the deficiencies and limitations described hereinabove.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, SRAM cells are one example of devices containing charge storage nodes that may be connected to a variable resistance as described supra. Other examples include dynamic random access memory cells, registers, latches and flip-flops. Therefore, it is intended that the following claims cover all such modifications and changes as fall within the true spirit and scope of the invention.

What is claimed is:

1. A method of forming an integrated circuit chip, comprising:
   forming solder bumps on a surface of said integrated circuit chip; and
   prior to bonding said integrated circuit chip to a module, forming a radiation-emitting layer over a selected region of a top surface of said integrated circuit chip by dispensing a liquid mixture comprising a polymer or resin and a radioactive material over said selected region, said region smaller than a whole of said top surface of said integrated circuit chip, said region including a circuit liable to temporary failure when struck by radiation generated by said radioactive material.

2. The method of claim 1, wherein said radioactive material is selected from the group consisting of $^{210}$Po, $^{210}$Pb, $^{241}$Am, $^{232}$Th, $^{NAT}$Sm, alpha-particle emitting isotopes of Th, U, Pu, Ra and Rn, or combinations thereof.

3. The method of claim 1, wherein said radiation-emitting mixture further includes one or more additional radioactive materials, said one or more additional radioactive materials different from said radioactive material and from each other, and said circuit liable to temporary failure when struck by radiation generated by said one or more additional radioactive materials.

4. The method of claim 1, further including:
forming an additional radiation-emitting layer over a top surface of said radiation-emitting layer by dispensing an additional liquid mixture comprising an additional polymer or resin and one or more additional radioactive materials, said one or more additional radioactive materials different from said radioactive material and from each other, said circuit liable to temporary failure when struck by radiation generated by said one or more additional radioactive material.

5. The method of claim 4, further including:
forming a radiation-attenuating layer between said radiation-emitting layer and said additional radiation-emitting layer.

6. The method of claim 1, further including:
forming a radiation-attenuating layer between said first radiation-emitting layer and said top surface of said selected region.

7. The method of claim 1, further including:
curing said radiation emitting layer by heating said radiation emitting layer to a temperature above room temperature or exposing said radiation emitting layer to ultraviolet radiation.

8. A method of an integrated circuit, comprising:
forming a radiation-emitting layer over a selected region of a top surface of said integrated circuit chip by dispensing a liquid mixture comprising a polymer or resin and a radioactive material over said selected region, said region smaller than a whole of said top surface of said integrated circuit chip, said region including a circuit liable to temporary failure when struck by radiation generated by said radioactive material;
forming a photoresist layer over said integrated circuit chip;
forming an opening in said photoresist layer over said selected region; and
dispensing said liquid mixture into said opening.

9. A method of forming an integrated circuit chip, comprising:
forming a first radiation-emitting layer over an entire top surface of said integrated circuit chip by dispensing a liquid mixture comprising a first polymer or resin and a first radioactive material over said entire top surface of said integrated circuit chip; and
photolithographically removing portions of said first radiation-emitting layer to form a first radiation-emitting island over a region of said integrated circuit chip, said region including a circuit liable to temporary failure when struck by radiation generated by said first radioactive material.

10. The method of claim 9, wherein:
either (i) if said first polymer or resin is not photosensitive, said photolithographically removing includes forming a layer of photoresist over said first radiation-emitting layer, defining a pattern in said photoresist layer and transferring said pattern into said radiation-emitting layer or (ii) if said first polymer or resin is photosensitive, said photolithographically removing includes directly patterning said radiation-emitting layer; and
said first radioactive material is selected from the group consisting of $^{210}$Po, $^{210}$Pb, $^{241}$Am, $^{232}$Th, $^{NAT}$Sm, alpha-particle emitting isotopes of Th, U, Pu, Ra and Rn, or combinations thereof.

11. The method of claim 9, wherein said first radiation-emitting mixture and said first radiation-emitting island further include a second radioactive material, said second radioactive material different from said first radioactive material, and said circuit liable to temporary failure when struck by radiation generated by said second radioactive material.

12. The method of claim 9, further including:
forming a radiation-attenuating layer between said first radiation-emitting island and said top surface of said region.

13. An integrated circuit, comprising:
solder bumps on a surface of said integrated circuit chip; and
a radiation-emitting layer over a selected region of a top surface of an integrated circuit chip, said radiation emitting layer comprising a first polymer or resin and a first radioactive material, said region smaller than a whole of said top surface of said integrated circuit chip, said region including a circuit that is liable to temporary failure when struck by radiation generated by said first radioactive material, a thickness of said radiation-emitting layer less than a height of said solder bumps.

14. The integrated circuit of claim 13, wherein:
said first radioactive material is selected from the group consisting of $^{210}$Po, $^{210}$Pb, $^{241}$Am, $^{232}$Th, $^{NAT}$Sm, alpha-particle emitting isotopes of Th, U, Pu, Ra and Rn, or combinations thereof.

15. The integrated circuit of claim 13, wherein said radiation-emitting layer further includes a second radioactive material, said second radioactive material different from said first radioactive material, and said circuit liable to temporary failure when struck by radiation generated by said second radioactive material.

16. The integrated circuit of claim 13, further including:
a second radiation-emitting layer over a top surface of said first radiation-emitting layer, said second radiation-emitting layer comprising a second polymer or resin and an second radioactive material, said second radioactive material different from said first radioactive material, said circuit liable to temporary failure when struck by radiation generated by said second radioactive material.

17. The integrated circuit of claim 16, further including:
a radiation-attenuating layer between said first radiation-emitting layer and said second radiation-emitting layer.

18. The integrated circuit of claim 13, further including:
a radiation-attenuating layer between said first radiation-emitting layer and said top surface of said region.

19. A method, comprising:
providing an integrated circuit chip having a functional circuit and a radiation-emitting layer containing a radioactive material formed over said functional circuit, said radiation-emitting layer containing a radioactive material, said radiation emitting-layer smaller than a whole of said top surface of said integrated circuit chip, said functional circuit liable to temporary failure when struck by radiation generated by said radioactive material;
measuring a soft-error rate of said functional circuit; and
adjusting operation of said functional circuit based on said measured soft-error rate of said functional circuit.

20. The method of claim 19, wherein said adjusting operation of said functional circuit comprises
adjusting error correction codes applied to data written to and read out of said functional circuit.

21. The method of claim 19, wherein adjusting operation of said functional circuit comprises adjusting a refresh rate of data stored in said functional circuit.

* * * * *